United States Patent
Shioda et al.

(10) Patent No.: US 10,665,608 B2
(45) Date of Patent: May 26, 2020

(54) SEMICONDUCTOR DEVICE AND MANUFACTURING METHOD THEREOF

(71) Applicant: TOSHIBA MEMORY CORPORATION, Minato-ku (JP)

(72) Inventors: Tomonari Shioda, Yokkaichi (JP); Junya Fujita, Nagoya (JP); Takayuki Ito, Yokkaichi (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 0 days.

(21) Appl. No.: 16/284,036

(22) Filed: Feb. 25, 2019

(65) Prior Publication Data

US 2019/0348434 A1 Nov. 14, 2019

(30) Foreign Application Priority Data

May 14, 2018 (JP) .................. 2018-093120

(51) Int. Cl.
*H01L 27/11582* (2017.01)
*G11C 5/06* (2006.01)
*H01L 27/1157* (2017.01)

(52) U.S. Cl.
CPC ........ *H01L 27/11582* (2013.01); *G11C 5/063* (2013.01); *H01L 27/1157* (2013.01)

(58) Field of Classification Search
CPC ......... H01L 21/02639; H01L 29/66628; H01L 29/0847; H01L 29/78
See application file for complete search history.

(56) References Cited

U.S. PATENT DOCUMENTS

| 5,967,794 A | * | 10/1999 | Kodama | ............ H01L 21/0445 438/300 |
| 8,367,528 B2 | * | 2/2013 | Bauer | ............... H01L 21/02381 438/507 |
| 8,901,537 B2 | | 12/2014 | Murthy et al. | |

FOREIGN PATENT DOCUMENTS

| JP | 2839018 | 12/1998 |
| JP | 4186247 | 11/2008 |
| JP | 2014-501452 | 1/2014 |

* cited by examiner

*Primary Examiner* — David C Spalla
(74) *Attorney, Agent, or Firm* — Oblon, McClelland, Maier & Neustadt, L.L.P.

(57) ABSTRACT

A semiconductor device according to an embodiment includes a substrate. A transistor includes a source layer and a drain layer that are provided in a surface region of the substrate and contain impurities. A gate dielectric film is provided on the substrate between the source layer and the drain layer. A gate electrode is provided on the gate dielectric film. A first epitaxial layer is provided on the source layer or the drain layer. A second epitaxial layer is provided on the first epitaxial layer and contains both the impurities and carbon. A contact plug is provided on the second epitaxial layer. A memory cell array is provided above the transistor.

20 Claims, 18 Drawing Sheets

SEMICONDUCTOR DEVICE AND MANUFACTURING METHOD THEREOF

CROSS REFERENCE TO RELATED APPLICATIONS

This application is based upon and claims the benefit of priority from the prior Japanese Patent Application No. 2018-093120, filed on May 14, 2018, the entire contents of which are incorporated herein by reference.

FIELD

The embodiments of the present invention relate to a semiconductor device and manufacturing method thereof.

BACKGROUND

NAND flash memories including a three-dimensional memory cell array have been recently developed. In the three-dimensional memory cell array, memory cells are arranged three-dimensionally. In this memory device, there is a case where a memory cell array is provided above a CMOS (Complementary Metal Oxide Semiconductor) circuit that controls the memory cell array. In this case, heat load is applied to the CMOS circuit or a contact plug in a heat treatment process when the memory cell array is formed, and adversely affects electrical characteristics of a CMOS or contact resistance. For example, boron that is used as impurities in a diffusion layer of a P-MOSFET (MOS Field Effect Transistor) causes a short channel effect when being diffused to a channel portion. Further, when boron in the diffusion layer is diffused to the contact plug, a metal material of the contact plug and boron react with each other, so that contact resistance is increased in some cases.

DETAILED DESCRIPTION

Figure 1:
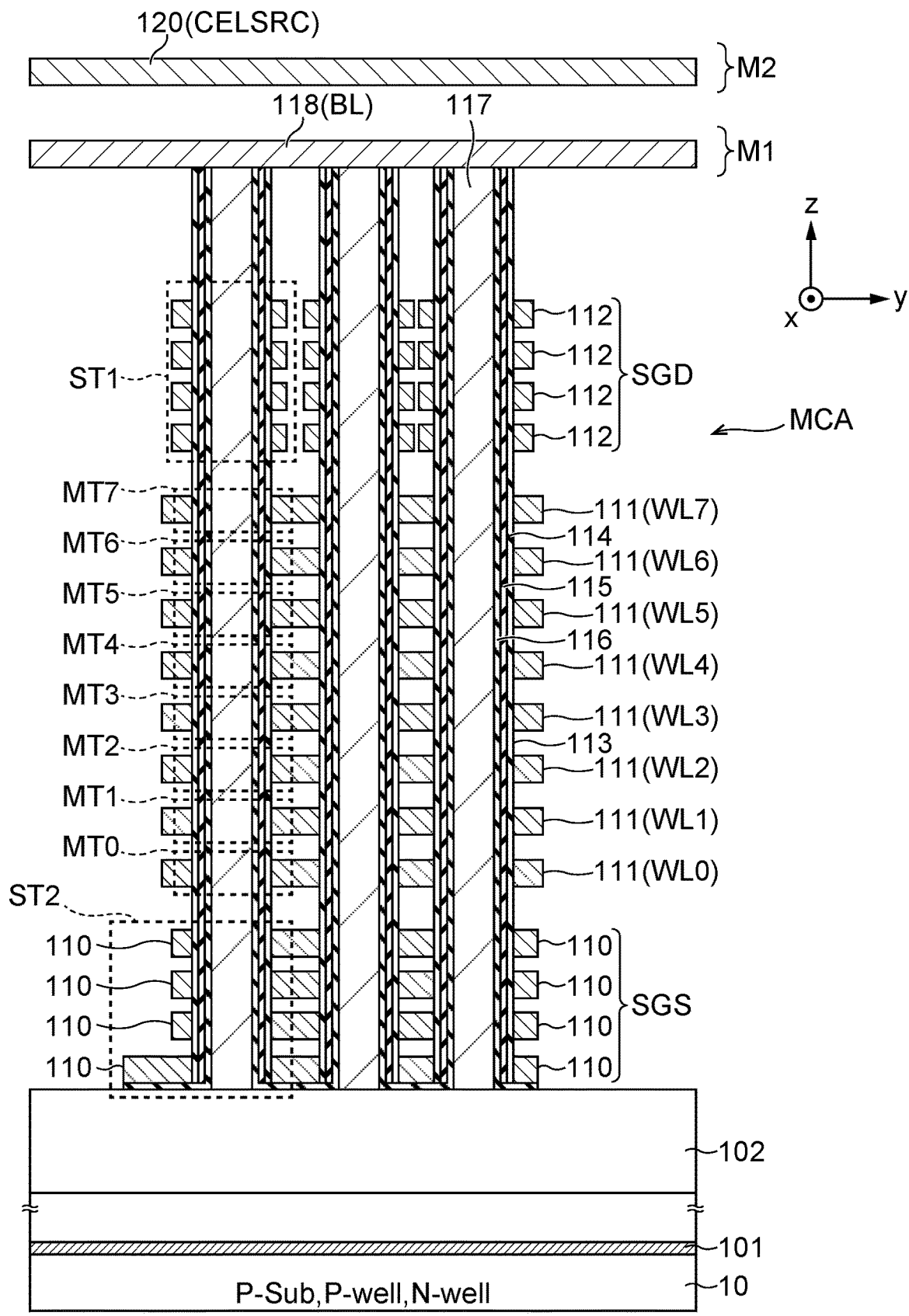
FIG. 1 is a diagram illustrating a configuration example of a memory cell array in a semiconductor device according to a first embodiment.

Embodiments will now be explained with reference to the accompanying drawings. The present invention is not limited to the embodiments. In the embodiments, "an upper direction" or "a lower direction" refers to a relative direction when a direction of a surface perpendicular to a semiconductor substrate on which semiconductor elements are provided is assumed as "an upper direction". Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A semiconductor device according to an embodiment includes a substrate. A transistor includes a source layer and a drain layer that are provided in a surface region of the substrate and contain impurities. A gate dielectric film is provided on the substrate between the source layer and the drain layer. A gate electrode is provided on the gate dielectric film. A first epitaxial layer is provided on the source layer or the drain layer. A second epitaxial layer is provided on the first epitaxial layer and contains both the impurities and carbon. A contact plug is provided on the second epitaxial layer. A memory cell array is provided above the transistor.

First Embodiment

FIG. 1 is a diagram illustrating a configuration example of a memory cell array in a semiconductor device according to a first embodiment. In FIG. 1, for easy understanding of the drawing, an insulating portion other than an insulating film formed in a memory hole 113 is omitted. Further, while silicon is exemplified as a semiconductor in the following embodiments, semiconductors other than silicon may be also used.

The present specification uses an XYZ orthogonal coordinate system for convenience of description. In this coordinate system, it is assumed that two directions that are parallel to a main surface of a semiconductor substrate 10 and are perpendicular to each other are the X-direction and the Y-direction, and a direction perpendicular to both the X-direction and the Y-direction is the Z-direction. A plurality of word lines WL are stacked in the Z-direction.

A control circuit 101 that controls a memory cell array MCA is provided in a surface region of the semiconductor substrate 10. The control circuit 101 is constituted by a CMOS circuit, for example. The CMOS circuit may be provided in a P-well or an N-well provided in the surface region of the semiconductor substrate 10. The memory cell array MCA including a plurality of memory cells is provided above the control circuit 101.

A plurality of NAND strings NS are formed on a polysilicon layer 102 arranged above the control circuit 101. Specifically, on the polysilicon layer 102, a plurality of wiring layers 110 that function as select gate lines SGS, a plurality of wiring layers 111 (word lines WL0 to WL7) that function as the word lines WL, and a plurality of wiring layers 112 that function as select gate lines SGD are formed.

The wiring layers 110 are constituted of four layers, for example, are electrically connected to a common select gate line SGS with a plurality of NAND strings NS, and function as a gate electrode of two selection transistors ST2.

The wiring layers 111 are constituted of eight layers, for example, and each of the layers is electrically connected to a common word line WL.

The wiring layers 112 are constituted of four layers, for example, are connected to corresponding select gate lines SGD for each NAND string NS, and each of the layers functions as a gate electrode of one selection transistor ST1.

The memory hole 113 is formed to penetrate through the wiring layers 110, 111, and 112 and to reach the polysilicon layer 102. On a side surface of the memory hole 113, a block insulating layer 114, a charge accumulating film 115, and a gate dielectric film 116 are formed in turn. A conductive film 117 is embedded in the memory hole 113. The conductive film 117 functions as a current path of a NAND string NS. A wiring layer 118 that functions as a bit line BL is formed at an upper end of the conductive film 117.

As described above, the selection transistor ST2, a plurality of memory cell transistors MT0 to MT7, and the selection transistor ST1 are stacked on the polysilicon layer 102 in turn, and one memory hole 113 corresponds to one NAND string NS. The memory cell transistors MT0 to MT7 are provided to correspond to intersections of the conductive film 117 and the word lines WL0 to WL7, respectively.

The configuration described above is arranged in plural in a depth direction of the drawing of FIG. 1. With this arrangement, the memory cell array MCA including memory cell transistors arranged three-dimensionally is configured.

Figure 2:
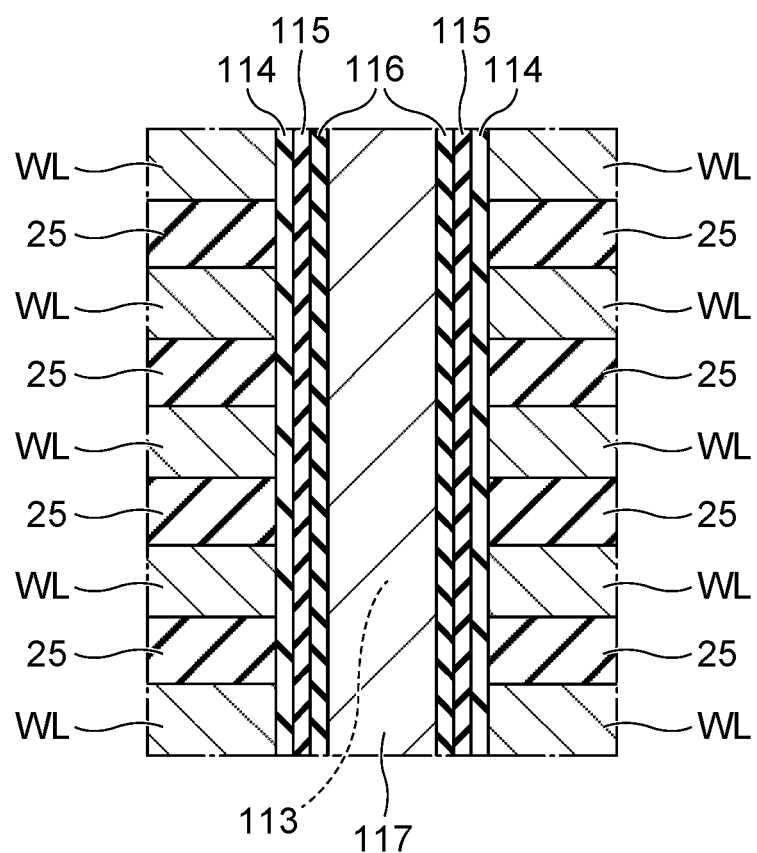
FIG. 2 is an enlarged cross-sectional view of a portion in which the conductive film penetrates through a plurality of word lines and an insulating layer between the word lines.

FIG. 2 is an enlarged cross-sectional view of a portion in which the conductive film 117 penetrates through a plurality of word lines WL and an insulating layer 25 between the word lines WL. In FIG. 2, an insulating layer between the conductive layers WL, which is omitted in FIG. 1, is represented as the insulating layer 25.

Between each conductive layer WL and the conductive film 117, the block insulating layer 114, the charge accumulating film 115, and the gate dielectric film 116 are provided in this order from the conductive layer WL side. The block insulating layer 114 is in contact with the conductive layer WL, the gate dielectric film 116 is in contact with the conductive film 117, and the charge accumulating film 115 is provided between the block insulating layer 114 and the gate dielectric film 116.

The conductive film 117 functions as a channel, the conductive layer WL functions as a control gate, and the charge accumulating film 115 functions as a data storage layer that accumulates charges injected from the conductive film 117. That is, a memory cell having a structure in which a control gate surrounds a channel is formed at an intersection of the conductive film 117 and each conductive layer WL.

The semiconductor device according to the present embodiment is a nonvolatile semiconductor storage device that can electrically erase and write data freely and can retain the stored contents even its power is turned off. For example, the memory cell is a memory cell having a charge trap structure. The charge accumulating film 115 has a number of traps for confining charges (electrons), and is a silicon nitride film, for example. The gate dielectric film 116 is a silicon oxide film, for example, and serves as a potential barrier when charges are injected to the charge accumulating film 115 from the conductive film 117 or when charges accumulated in the charge accumulating film 115 are diffused to the conductive film 117. The block insulating layer 114 is a silicon oxide film, for example, and prevents diffusion of charges accumulated in the charge accumulating film 115 to the conductive layer WL. The semiconductor device may be a NAND flash memory, for example.

Figure 3:
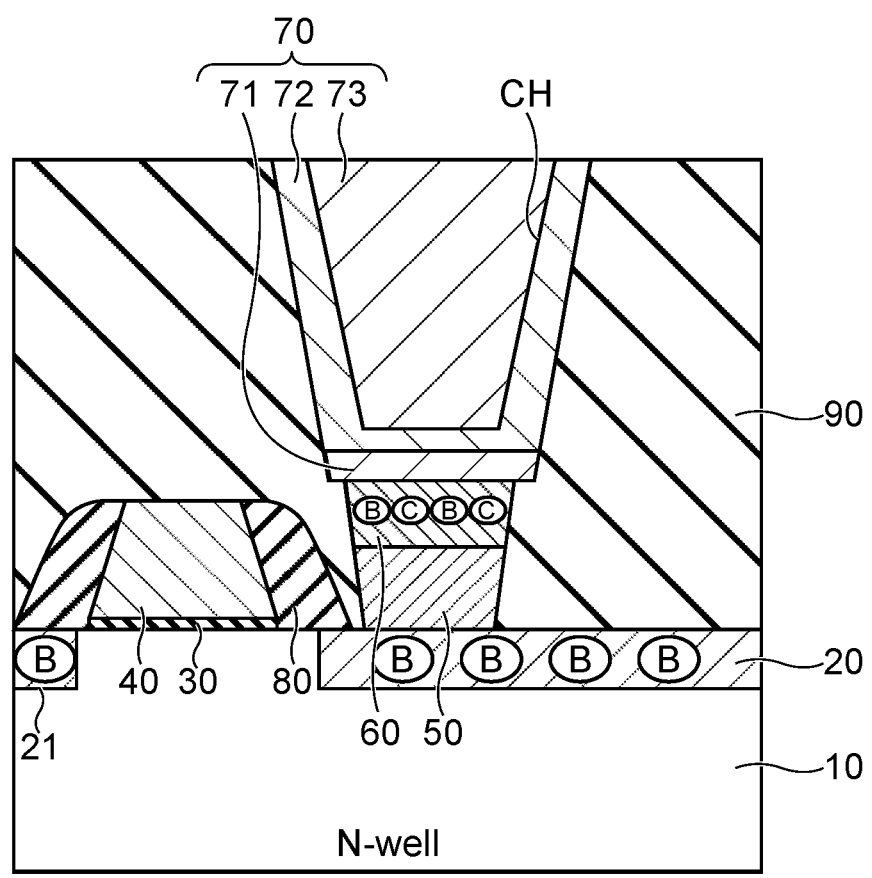
FIG. 3 is a cross-sectional view illustrating a configuration example of a P-MOSFET of the control circuit.

FIG. 3 is a cross-sectional view illustrating a configuration example of a P-MOSFET of the control circuit 101. The P-MOSFET (hereinafter, also simply "transistor") includes the semiconductor substrate 10, a drain layer 20, a source layer 21, a gate dielectric film 30, a gate electrode 40, a first epitaxial layer 50, a second epitaxial layer 60, a contact plug 70, a spacer film 80, and an interlayer dielectric film 90. The transistor is provided as a portion of a CMOS that configures a control circuit that controls the memory cell array MCA.

The semiconductor substrate 10 is, for example, a P-silicon substrate with a P-well or an N-well provided in its surface region. A P-MOSFET is provided in an N-well, and an N-MOSFET is provided in a P-well. In the present embodiment, because the transistor is a P-MOSFET, the transistor is provided in a surface region of the N-well of the semiconductor substrate 10.

The drain layer 20 and the source layer 21 are diffusion layers that are provided in the N-well of the semiconductor substrate 10 and contain impurities. The impurities are boron, for example. In a case where the transistor is an N-MOSFET, the drain layer 20 and the source layer 21 are provided in the P-well of the semiconductor substrate 10, and impurities in this case are phosphorus or arsenic, for example.

The gate dielectric film 30 is provided on the semiconductor substrate 10 between the drain layer 20 and the source layer 21. A silicon oxide film or a high dielectric material with a higher relative permittivity than a silicon oxide film is used for the gate dielectric film 30, for example.

The gate electrode 40 is provided on the gate dielectric film 30. A conductive material such as doped polysilicon or metal is used for the gate electrode 40.

The first epitaxial layer 50 is provided on the drain layer 20 to reach a level higher than the surface of the semiconductor substrate 10. The first epitaxial layer 50 is an undoped epitaxial silicon layer with a lower impurity concentration than that of the second epitaxial layer 60.

The second epitaxial layer 60 is a doped epitaxial silicon layer that is provided on the first epitaxial layer 50 and is doped with both boron and carbon as its impurities. For example, the boron concentration in the second epitaxial layer is $1 \times 10^{21}$ cm$^{-3}$ or more and the carbon concentration is $3 \times 10^{20}$ cm$^{-3}$ or more. The thickness of the second epitaxial layer 60 is 10 nm or more.

The contact plug 70 is provided on the second epitaxial layer 60. The contact plug 70 includes a silicide layer 71, a barrier metal layer 72, and a plug 73. The silicide layer 71 is provided between the barrier metal layer 72 and the second epitaxial layer 60, and is formed by reaction between metal in the barrier metal layer 72 and silicon in the second epitaxial layer 60.

The barrier metal layer 72 is thinly provided on an inner wall of a contact hole CH on the second epitaxial layer 60.

Ti or TiN is used for the barrier metal layer 72, for example. In this case, the silicide layer 71 is TiSi (titanium silicide). When boron and carbon are diffused from the second epitaxial layer 60, the silicide layer 71 is TiSi containing B and C.

The plug 73 is filled in the contact hole CH. W (tungsten) is used for the plug 73, for example.

The spacer film 80 is provided on a side surface of the gate electrode 40 to protect the gate electrode 40. For example, an insulating film such as a silicon oxide film or a silicon nitride film is used as the spacer film 80.

The interlayer dielectric film 90 is provided above the gate electrode 40. The interlayer dielectric film 90 has the contact hole CH formed therein. In the contact hole CH, the contact plug 70 is provided. An insulating film such as a silicon oxide film is used as the interlayer dielectric film 90.

The contact plug 70 is electrically connected to other elements of the control circuit 101 or the memory cell array MCA. The contact plug 70 is included between the substrate 10 and the memory cell array MCA.

Although not illustrated in the drawings, the first and second epitaxial layers 50 and 60 and the contact plug 70 are also provided on the source layer 21. In addition, while the transistor is a P-MOSFET, it is permissible that the transistor is an N-MOSFET. However, adverse effects of heat load, for example, a short channel effect and increase of contact resistance, are relatively large in a P-MOSFET because boron as P-type impurities can be more easily diffused as compared to phosphorus or arsenic as N-type impurities. Therefore, in the present embodiment, descriptions are provided assuming that the transistor is a P-MOSFET.

FIGS. 4A to 4E are cross-sectional views illustrating first and second epitaxial layers and its vicinity. In FIGS. 4A to 4E, contact resistance from the contact plug 70 to the drain layer 20 or the source layer 21 is described below the cross-sectional views. A contact resistance value itself is varied with a cross-sectional area of a contact. Therefore, in the present embodiment, the contact resistance value is represented by a normalized value.

Figure 4A:
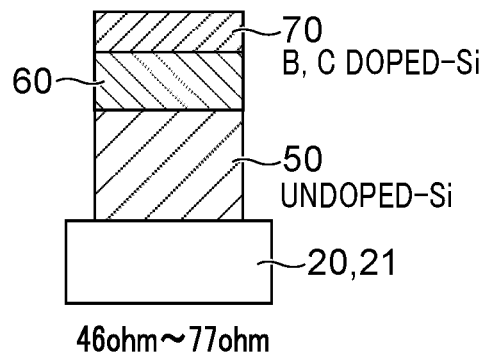
FIGS. 4A to 4E are cross-sectional views illustrating first and second epitaxial layers and its vicinity.

In FIG. 4A, a cross-sectional configuration of the first and second epitaxial layers 50 and 60 according to the first embodiment is illustrated. The first epitaxial layer 50 is provided on the drain layer 20 or the source layer 21 of the semiconductor substrate 10. The first epitaxial layer 50 is an undoped epitaxial silicon layer. The undoped epitaxial silicon layer is a layer of single-crystalline silicon formed by epitaxial growth without introduction of impurities. The second epitaxial layer 60 is provided on the first epitaxial layer 50. The second epitaxial layer 60 is a B, C-doped epitaxial layer with boron and carbon doped. The B, C-doped epitaxial layer is a layer of single-crystalline silicon formed by epitaxial growth while boron and carbon are introduced. The B, C-doped epitaxial layer may be polysilicon. The contact plug 70 is provided on the second epitaxial layer 60.

In the contact structure illustrated in FIG. 4A, the contact resistance from the contact plug 70 to the drain layer 20 or the source layer 21 is about 46 ohms to about 77 ohms. The reason why the contact resistance is relatively low in the contact structure according to the present embodiment is as follows.

First, the second epitaxial layer 60 is a B, C-doped epitaxial layer that contains both boron and carbon. Because carbon is contained, thermal diffusion of boron is suppressed, so that it is possible to keep a boron concentration in the second epitaxial layer 60 high. For example, when boron is diffused to the contact plug 70, a high-resistance material such as TiB is inevitably formed between the contact plug 70 and the second epitaxial layer 60. On the other hand, according to the present embodiment, carbon in the second epitaxial layer 60 suppresses diffusion of boron, so that it is possible to suppress formation of TiB and keep the contact resistance low. In addition, because the boron concentration in the second epitaxial layer 60 can be kept high, it is possible to keep the contact resistance and the resistance of the second epitaxial layer 60 itself low.

When the memory cell array MCA is not provided above a transistor of the control circuit 101, for example, when the memory cell array MCA is provided on a side of the transistor, a contact plug can be formed after the transistor is formed. In this case, heat load applied when the memory cell array MCA is formed is not applied to the contact plug, and diffusion of boron described above can be suppressed. However, because the control circuit 101 is arranged side by side with the memory cell array MCA, the chip area is increased. When the memory cell array MCA is provided above the transistor of the control circuit 101, it is possible to make the chip area small. Alternatively, when the memory cell array MCA is provided above the transistor of the control circuit 101, it is possible to make the number of memory cell arrays MCA per chip area (cell density) twice the number when the control circuit 101 is arranged beside the memory cell array MCA. According to the present embodiment, it is possible to produce a semiconductor device having high-density memory cell arrays while reducing contact resistance.

Further, the first epitaxial layer 50 that is in contact with the drain layer 20 or the source layer 21 is an undoped epitaxial layer, and is provided to reach a level higher than the surface of the drain layer 20 or the source layer 21. By the undoped epitaxial layer 50 provided on the drain layer 20 or the source layer 21, the crystalline state of the B, C-doped epitaxial layer 60 and an interface between the doped epitaxial layer 60 and its underlying layer become better, so that the resistance of the B, C-doped epitaxial layer 60 is reduced. Therefore, the resistance of the second epitaxial layer 60 is reduced by stacking the first and second epitaxial layers 50 and 60 on the drain layer 20 or the source layer 21.

Furthermore, the first epitaxial layer 50 does not contain impurities that are diffused to the drain layer 20 or the source layer 21, and isolates the second epitaxial layer 60 containing such impurities from the drain layer 20 or the source layer 21. Therefore, the first epitaxial layer 50 suppresses entrance of boron from the second epitaxial layer 60 caused by heat load to the drain layer 20, the source layer 21, or a channel region of a transistor. As a result, a short channel effect of the transistor can be suppressed.

As described above, in the transistor according to the present embodiment, it is possible to suppress increase of contact resistance and a short channel effect that are caused by heat load in the process of forming the memory cell array MCA.

Figure 4B:
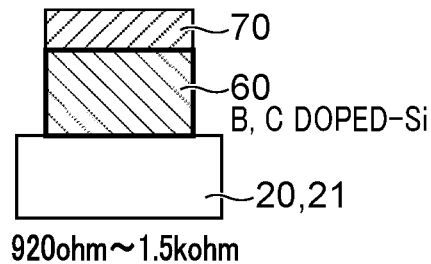

In the contact structure illustrated in FIG. 4B, the first epitaxial layer 50 is omitted as compared to that in FIG. 4A. In this case, the second epitaxial layer 60 is formed directly on the drain layer 20 or the source layer 21. Therefore, the crystalline state of the second epitaxial layer 60 is worse than the structure illustrated in FIG. 4A. Also, the second epitaxial layer 60 is not deposited stably, so that thickness variation can easily occur. As a result, the contact resistance value is increased, and variation of the resistance value becomes large. In the contact structure illustrated in FIG.

4B, the contact resistance from the contact plug 70 to the drain layer 20 or the source layer 21 was about 920 ohms to about 1.5 kohms.

Figure 4C:
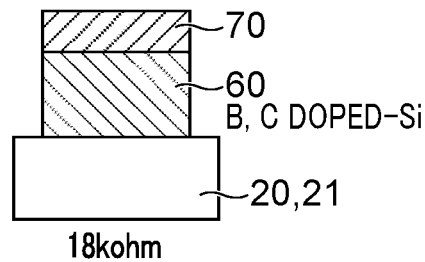

The contact structure illustrated in FIG. 4C is different from the structure illustrated in FIG. 4B in a method of introducing carbon into the second epitaxial layer 60. In FIG. 4C, the second epitaxial layer 60 is formed by causing epitaxial growth of single-crystalline silicon while introducing boron. Thereafter, carbon is introduced into the second epitaxial layer 60 by ion implantation. Other configurations of the contact structure illustrated in FIG. 4C are identical to those in the structure illustrated in FIG. 4B. In this case, ion implantation of carbon makes the crystalline state of the second epitaxial layer 60 even worse. Therefore, the resistance value of the second epitaxial layer 60 is increased. The contact resistance in this case was about 18 kohms.

Figure 4D:
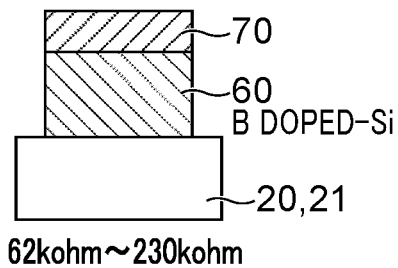

The contact structure illustrated in FIG. 4D is different from the structure illustrated in FIG. 4B or 4C in that carbon is not introduced into the second epitaxial layer 60. The second epitaxial layer 60 is formed by causing epitaxial growth of single-crystalline silicon while introducing boron. At this time, carbon is not introduced into the second epitaxial layer 60. That is, the second epitaxial layer 60 is a boron-doped epitaxial layer. In this case, boron in the second epitaxial layer 60 is diffused by heat load. Therefore, the contact resistance was as high as about 62 kohms to about 230 kohms.

Figure 4E:
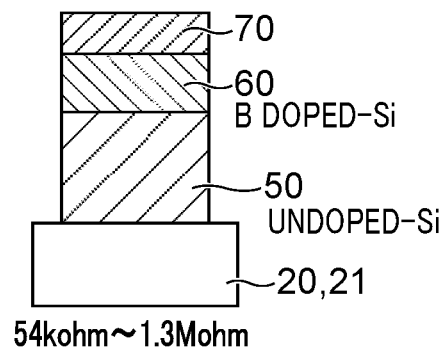

The contact structure illustrated in FIG. 4E is different from the structure illustrated in FIG. 4D in including the first epitaxial layer 50. The first epitaxial layer 50 is provided between the second epitaxial layer 60 and the drain layer 20 or the source layer 21. The second epitaxial layer 60 is formed by causing epitaxial growth of single-crystalline silicon while introducing boron. At this time, carbon is not introduced into the second epitaxial layer 60. That is, the second epitaxial layer 60 is a boron-doped epitaxial layer. In this case, the crystalline state of the second epitaxial layer 60 is favorable because the first epitaxial layer 50 is present between the second epitaxial layer 60 and the drain layer 20 or the source layer 21. However, because of diffusion of boron to the contact plug 70 by heat load, the contact resistance became as high as about 54 kohms to about 1.3 Mohms.

As described above, in the contact structure according to the present embodiment illustrated in FIG. 4A, carbon suppresses diffusion of boron, and the crystalline state of the second epitaxial layer 60 is made favorable because of the first epitaxial layer 50. Therefore, the contact structure in FIG. 4A can suppress contact resistance to a lower level as compared to the contact structures in FIGS. 4B to 4E.

In a semiconductor memory device in which the memory cell array MCA is provided above the control circuit 101 as illustrated in FIG. 1, heat load in the process of forming the memory cell array MCA is applied to a CMOS of the control circuit 101 and a metal plug. Therefore, by using the contact structure in FIG. 4A in the control circuit 101 of the semiconductor memory device, it is possible to keep the contact resistance of the control circuit 101 low and to suppress a short channel effect, even when large heat load is applied. This effects lead to improvement of electrical characteristics of the control circuit 101. For example, it is necessary to set the contact resistance to about 100 ohms or less in a certain semiconductor memory device. In this case, the contact structure in FIG. 4A can satisfy this requirement, but the contact structures in FIGS. 4B to 4E cannot satisfy this requirement.

In FIG. 4A, one layer is stacked for each of the first and second epitaxial layers 50 and 60. However, multiple layers may be stacked for each of the first and second epitaxial layers 50 and 60. For example, a plurality of first epitaxial layers 50 and a plurality of second epitaxial layers 60 may be stacked between the drain layer 20 or the source layer 21 and the contact plug 70 in the order of the first epitaxial layer 50, the second epitaxial layer 60, the first epitaxial layer 50, and the second epitaxial layer 60. Even when the layers 50 and 60 are stacked in this manner, the advantageous effects of the present embodiment are not lost.

Figure 5A:
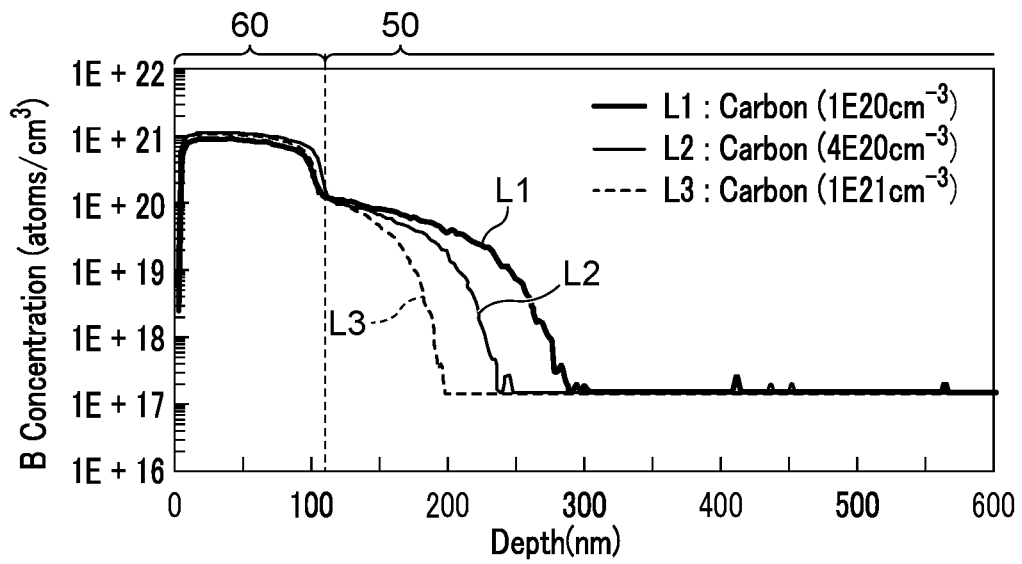
FIGS. 5A and 5B are graphs representing boron concentrations in the first and second epitaxial layers.
Figure 5B:
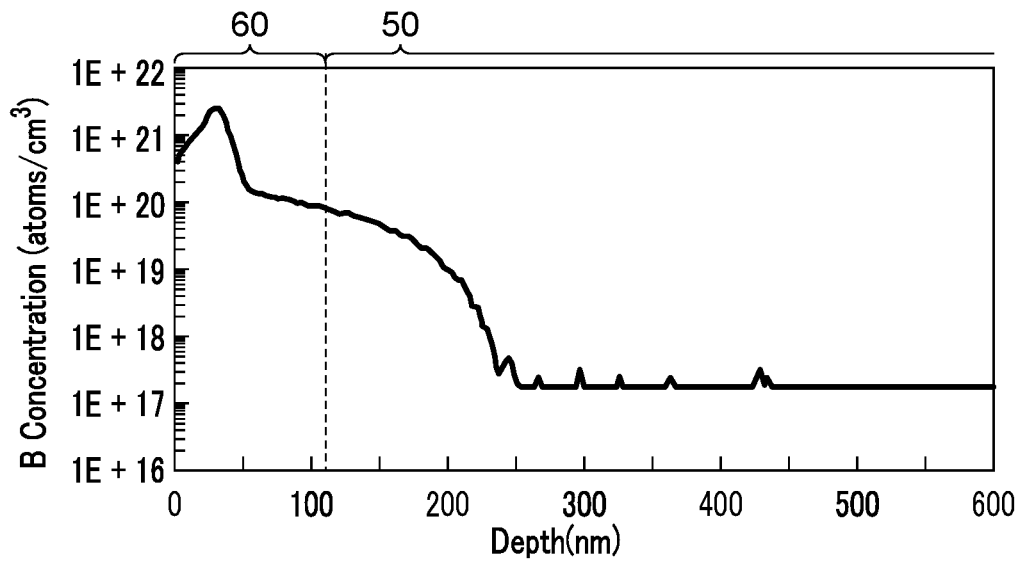

FIGS. 5A and 5B are graphs representing boron concentrations in the first and second epitaxial layers 50 and 60. The vertical axis represents a boron concentration, and the horizontal axis represents a depth from the surface of the second epitaxial layer 60. The second epitaxial layer 60 illustrated in FIG. 5A is formed by causing epitaxial growth of silicon while introducing boron and carbon. The second epitaxial layer 60 illustrated in FIG. 5B is formed by causing epitaxial growth of silicon while introducing boron, and thereafter performing ion implantation of carbon. Both these graphs illustrate boron concentration profiles after head load is applied in formation of the memory cell array MCA.

As illustrated in FIG. 5A, when epitaxial growth is caused while boron and carbon are introduced, it is found that the boron concentration in the second epitaxial layer 60 is stable in a depth direction. This is because boron is not diffused much to a portion near the surface of the second epitaxial layer 60 to a portion near the back thereof.

Further, lines L1 to L3 are different in a carbon concentration in the second epitaxial layer 60. The carbon concentrations become high in the order of the lines L1, L2, and L3. Here, it is found that diffusion (soaking) of boron from the second epitaxial layer 60 to the first epitaxial layer 50 is less as the carbon concentration is higher. That is, it is found that diffusion of boron in the second epitaxial layer 60 is suppressed by making the carbon concentration in the second epitaxial layer 60 higher. With this configuration, increase of contact resistance and a short channel effect can be suppressed.

With reference to FIG. 5B, in a case where ion implantation of carbon is performed after epitaxial growth of silicon, the boron concentration in the second epitaxial layer 60 is not very stable in the depth direction. Particularly, the boron concentration is lowered near the surface of the second epitaxial layer 60, and there is a concern of diffusion of boron toward the contact plug 70. Diffusion of boron toward the contact plug 70 leads to increase of contact resistance. Therefore, it is preferable to epitaxially grow the second epitaxial layer 60 while both boron and carbon are introduced.

Figure 6:
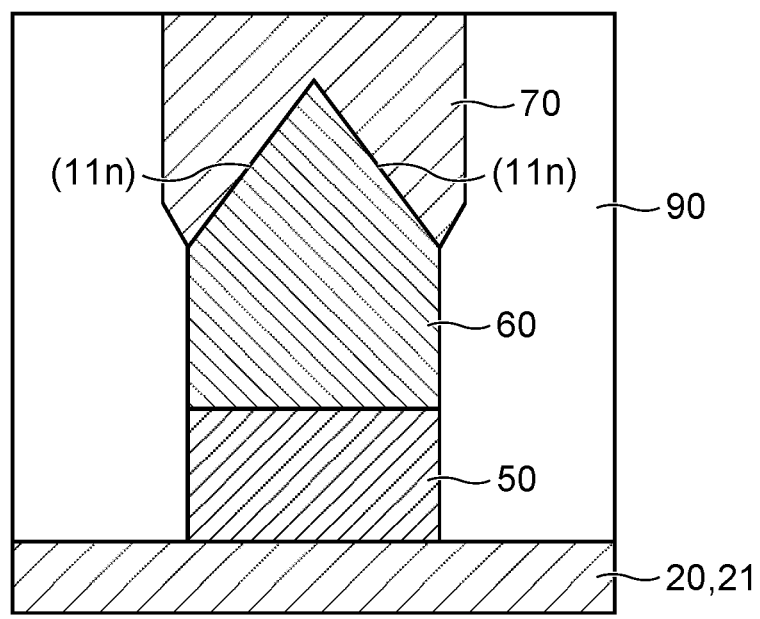
FIG. 6 is a cross-sectional view illustrating an example of a contact structure of a semiconductor device according to the first embodiment.

FIG. 6 is a cross-sectional view illustrating an example of a contact structure of a semiconductor device according to the first embodiment. In the contact structure according to the present embodiment, the second epitaxial layer 60 is formed by causing epitaxial growth of silicon on the first epitaxial layer 50. At this time, there is a case where a top surface of the second epitaxial layer 60 includes the (11n) surface (n is a positive integer), assuming that the surface of the semiconductor substrate 10 is the (001) surface. That is, as illustrated in FIG. 6, the top surface of the second epitaxial layer 60 is a facet inclined with respect to the surface of the semiconductor substrate 10. For example, when the top surface of the second epitaxial layer 60 is the (111) surface, the inclination angle of the top surface is about 54°. When the top surface of the second epitaxial layer 60 is the (113) surface, the inclination angle of the top surface is about 25°. As described above, from the fact that the top surface of the second epitaxial layer 60 includes a facet inclined with respect to the surface of the semiconductor substrate 10, it is found that the second epitaxial layer 60 is formed by epitaxial growth.

Next, a manufacturing method of a semiconductor device according to the present embodiment is described.

FIGS. 7 to 12 are cross-sectional views respectively illustrating an example of a manufacturing method of a semiconductor device according to the first embodiment. The semiconductor substrate 10 has a P-well and an N-well formed therein as appropriate. FIGS. 7 to 12 illustrate a manufacturing method of a P-MOSFET as a transistor.

Figure 7:
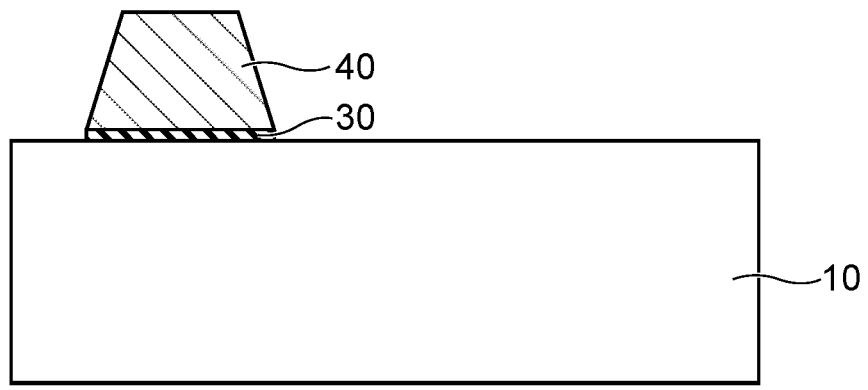
FIGS. 7 to 12 are cross-sectional views respectively illustrating an example of a manufacturing method of a semiconductor device according to the first embodiment.

First, the gate dielectric film 30 is formed on the semiconductor substrate 10, as illustrated in FIG. 7. It is permissible that the gate dielectric film 30 is a silicon oxide film formed by thermal oxidation or a high dielectric material formed by deposition. Next, the material for the gate electrode 40 is deposited on the gate dielectric film 30. The material for the gate electrode 40 is then processed by lithography and RIE (Reactive Ion Etching), for example. With these processes, the structure illustrated in FIG. 7 is obtained.

Figure 8:
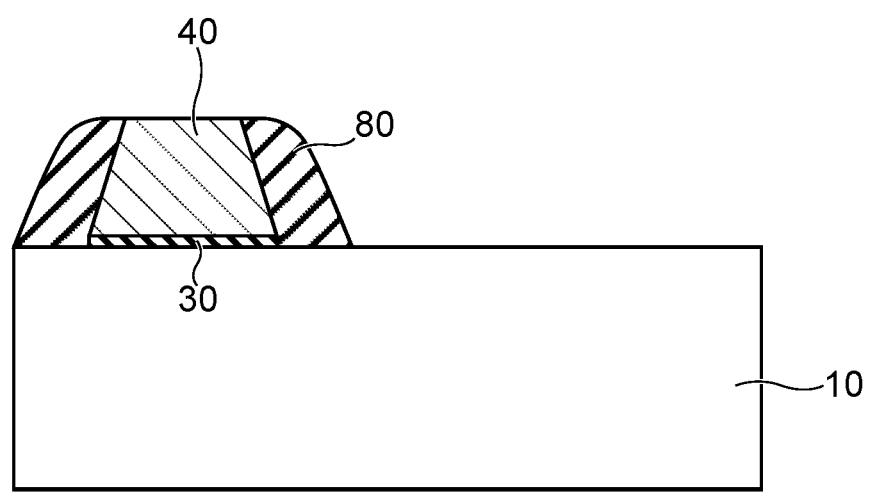

Next, an extension layer (not illustrated) may be formed by introducing impurities such as boron by using the gate electrode 40 as a mask. Subsequently, an insulating film such as a silicon oxide film is deposited on the gate electrode 40, and this insulating film is etched back. With this process, as illustrated in FIG. 8, the spacer film 80 is formed on a side surface of the gate electrode 40.

Figure 9:
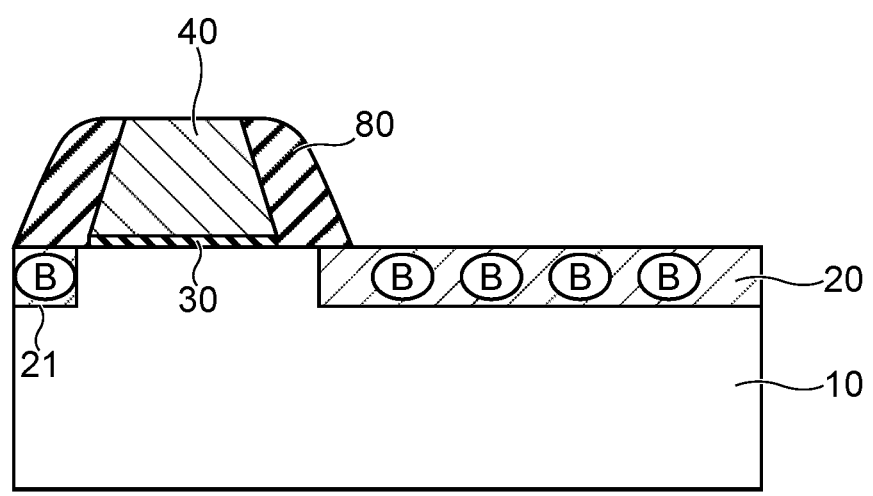

Subsequently, by using the gate electrode 40 and the spacer film 80 as a mask, impurities such as boron are introduced into a surface region of the semiconductor substrate 10. With this introduction, as illustrated in FIG. 9, the drain layer 20 and the source layer 21 are formed in the surface region of the semiconductor substrate 10.

Figure 10:
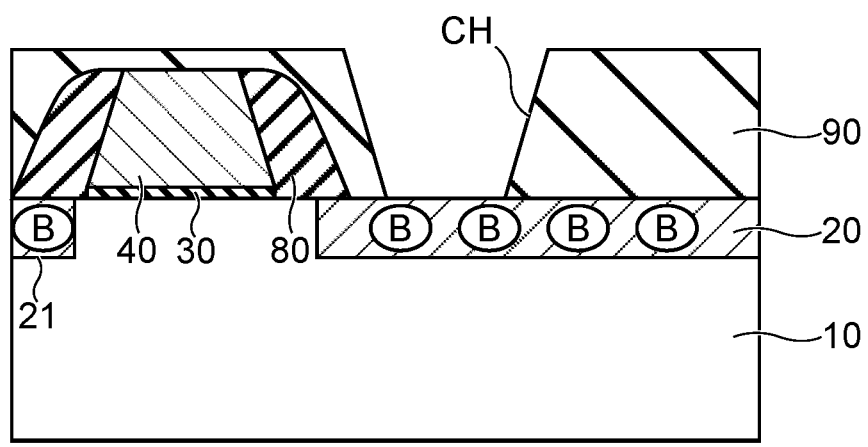

Next, the interlayer dielectric film 90 is deposited on the gate electrode 40 and the semiconductor substrate 10. The interlayer dielectric film 90 may be a silicon oxide film using TEOS (Tetraethoxysilane), for example. Subsequently, as illustrated in FIG. 10, the contact hole CH is formed in the interlayer dielectric film 90 by using lithography and RIE, for example. The contact hole CH is formed to reach the drain layer 20 and the source layer 21.

Figure 11:
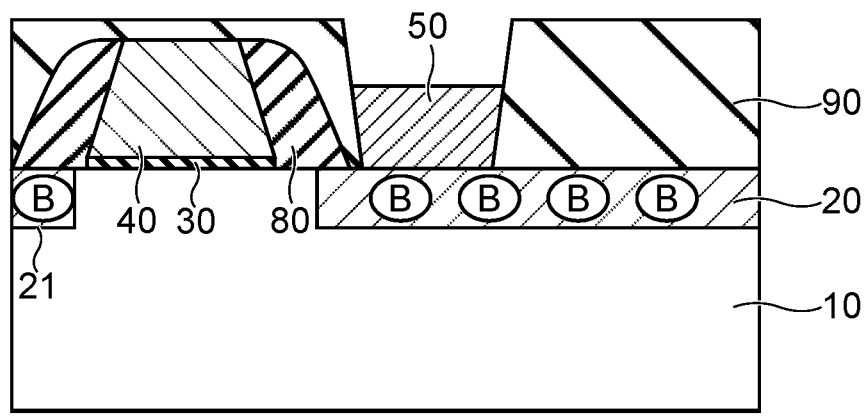

Next, as illustrated in FIG. 11, the first epitaxial layer 50 is formed in the contact hole CH by using epitaxial growth. The first epitaxial layer 50 is a undoped silicon crystal layer and is formed on the drain layer 20 and the source layer 21 to reach a level higher than the surface of the semiconductor substrate 10. The first epitaxial layer 50 may contain about $2 \times 10^{19}$ cm$^{-3}$ or less of boron.

Figure 12:
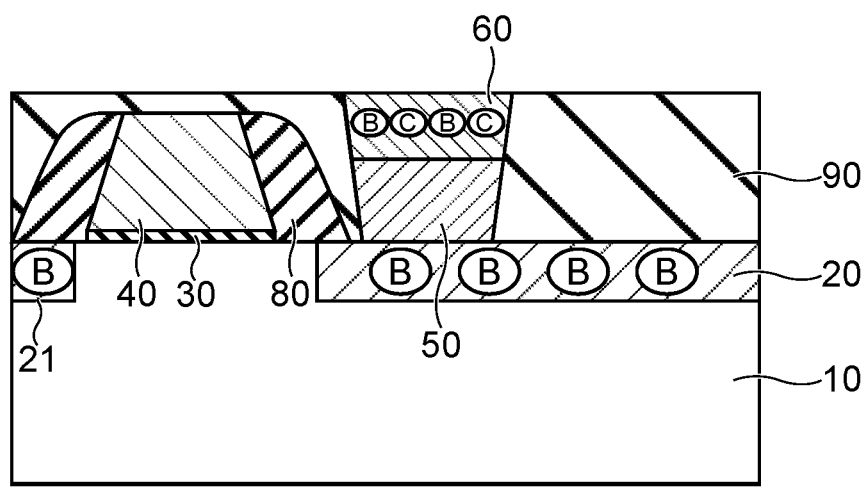

Subsequently, as illustrated in FIG. 12, the second epitaxial layer 60 is formed on the first epitaxial layer 50 in the contact hole CH by using epitaxial growth. The second epitaxial layer 60 is a doped silicon crystal layer formed by epitaxial growth while both boron and carbon are doped. For example, a boron concentration is $1 \times 10^{21}$ cm$^{-3}$ or more and a carbon concentration is $3 \times 10^{20}$ cm$^{-3}$ or more. With this epitaxial growth, the second epitaxial layer 60 containing boron and carbon is formed on the first epitaxial layer 50 that is undoped. At this time, as illustrated in FIG. 6, the top surface of the second epitaxial layer 60 epitaxially grows to have the (11n) surface.

It is also possible that the second epitaxial layer 60 is formed by causing epitaxial growth of silicon crystal while introducing boron, and thereafter performing ion implantation of carbon. Alternatively, it is possible that the second epitaxial layer 60 is formed by causing epitaxial growth of silicon crystal without introducing impurities, and thereafter performing ion implantation of boron and carbon. However, in order to suppress the contact resistance to a low level, it is preferable that the second epitaxial layer 60 is formed by causing epitaxial growth of silicon crystal while both boron and carbon are doped, as described with reference to FIGS. 4 and 5.

Next, the interlayer dielectric film 90 is further deposited, and the contact hole CH is formed on the second epitaxial layer 60 by using lithography and RIE, for example. Subsequently, a metal material is formed in the contact hole CH, so that the contact plug 70 is formed on the second epitaxial layer 60. For example, the barrier metal layer 72 is formed in the contact hole CH thinly, and the plug 73 is further filled in the contact hole CH. Ti or TiN is used for the barrier metal layer 72, for example. Tungsten is used for the plug 73, for example. Accordingly, the contact plug 70 including the barrier metal layer 72 and the plug 73 is formed. Thereafter, the silicide layer 71 made of a material such as TiSi is formed between the barrier metal layer 72 and the second epitaxial layer 60 by heat load in the process of forming the memory cell array MCA.

With these processes, the structure of the transistor illustrated in FIG. 3 is obtained. Thereafter, the memory cell array MCA is formed above the transistor (the gate electrode 40). At this time, heat load is applied to the transistor. However, the contact structure of the transistor of the control circuit 101 according to the present embodiment includes the first epitaxial layer 50 that is undoped and the second epitaxial layer 60 containing boron and carbon on the first epitaxial layer 50. Therefore, it is possible to keep the contact resistance between the contact plug 70 and the drain layer 20 or the source layer 21 low and to suppress a short channel effect.

(Configuration of Second Epitaxial Layer 60)

Figure 13:
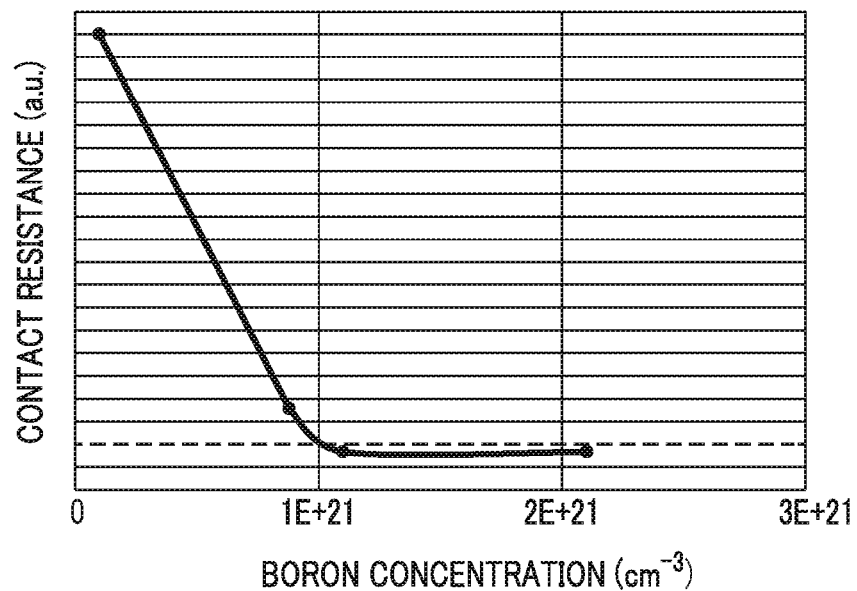
FIG. 13 is a graph representing a relation between a boron concentration in the second epitaxial layer and contact resistance.

FIG. 13 is a graph representing a relation between a boron concentration in the second epitaxial layer 60 and contact resistance. The horizontal axis represents a boron concentration and the vertical axis represents contact resistance. Note that the contact resistance is represented with an arbitrary unit. According to this graph, it is found that a boron concentration of $1 \times 10^{21}$ cm$^{-3}$ or more is preferable. When being less than $1 \times 10^{21}$ cm$^{-3}$, the boron concentration is further lowered by heat load during formation of the memory cell array MCA. Therefore, the Schottky barrier between the second epitaxial layer 60 and the contact plug 70 is not sufficiently lowered, and thus the contact resistance becomes high.

Figure 14:
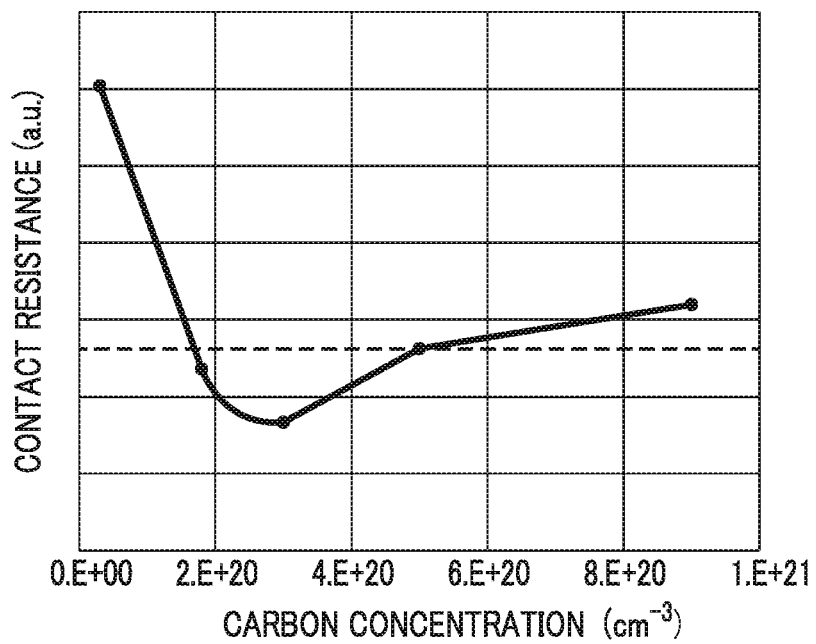
FIG. 14 is a graph representing a relation between a carbon concentration in the second epitaxial layer and contact resistance.

FIG. 14 is a graph representing a relation between a carbon concentration in the second epitaxial layer 60 and contact resistance. The horizontal axis represents a carbon concentration and the vertical axis represents contact resistance. Note that the contact resistance is represented with an arbitrary unit. According to this graph, it is found that a carbon concentration of $1 \times 10^{20}$ cm$^{-3}$ or more and $5 \times 10^{20}$ cm$^{-3}$ or less is preferable. When the carbon concentration is less than $1 \times 10^{20}$ cm$^{-3}$, carbon cannot sufficiently suppress diffusion of boron during formation of the memory cell array MCA, and thus the contact resistance becomes high. When the carbon concentration is larger than $5 \times 10^{20}$ cm$^{-3}$, the resistance of the second epitaxial layer 60 itself becomes high.

Figure 15:
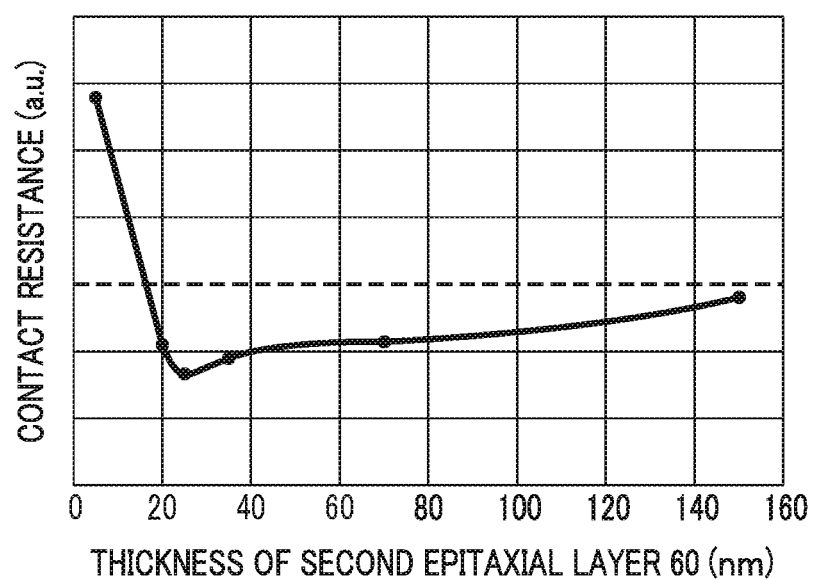
FIG. 15 is a graph representing a relation between the thickness of the second epitaxial layer and contact resistance.

FIG. 15 is a graph representing a relation between the thickness of the second epitaxial layer 60 and contact resistance. The horizontal axis represents the thickness of the second epitaxial layer 60 and the vertical axis represents contact resistance. Note that the contact resistance is represented with an arbitrary unit. According to this graph, it is found that the thickness of the second epitaxial layer 60 is preferably 10 nm or more and less than 150 nm. When the thickness is thinner than 10 nm, the second epitaxial layer 60 cannot reduce the width of the Schottky barrier sufficiently, so that the contact resistance is increased. When the thickness is 150 nm or more, the resistance of the second epitaxial layer 60 itself becomes high. Further, formation of the second epitaxial layer 60 takes a longer time, and it worsens productivity.

Second Embodiment

Figure 16:
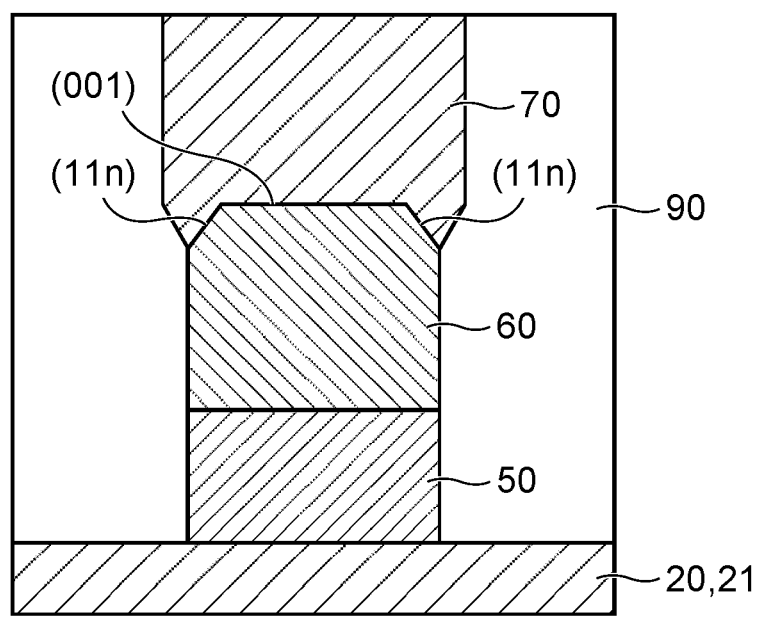
FIG. 16 is a cross-sectional view illustrating an example of a contact structure of a semiconductor device according to a second embodiment.

FIG. 16 is a cross-sectional view illustrating an example of a contact structure of a semiconductor device according to a second embodiment. The second epitaxial layer 60 is formed by causing epitaxial growth of silicon on the first epitaxial layer 50. At this time, a top surface of the second epitaxial layer 60 includes both the (001) surface and the (11n) surface, assuming that the surface of the semiconductor substrate 10 is the (001) surface. That is, as illustrated in FIG. 16, the top surface of the second epitaxial layer 60 includes a surface substantially parallel to the surface of the semiconductor substrate 10 and a facet inclined with respect to the surface of the semiconductor substrate 10. The (11n) surface is provided around the (001) surface, and is arranged between the (001) surface and a side surface of the second epitaxial layer 60. It suffices that the (11n) surface has the inclination angle described in the first embodiment. Other configurations of the second embodiment may be identical to the corresponding ones of the first embodiment. Further, the impurity concentrations of the epitaxial layers 50 and 60 may be the same as the impurity concentrations of these layers in the first embodiment.

As described above, from the fact that the top surface of the second epitaxial layer 60 includes a facet inclined with respect to the surface of the semiconductor substrate 10, it is found that the second epitaxial layer 60 is formed by epitaxial growth. Further, although the top surface of the second epitaxial layer 60 includes the (001) surface, the contact resistance of this structure was substantially identical to the contact resistance of the structure illustrated in FIG. 4A. Therefore, the second embodiment can achieve effects identical to those of the first embodiment.

(First Modification)

Figure 17:
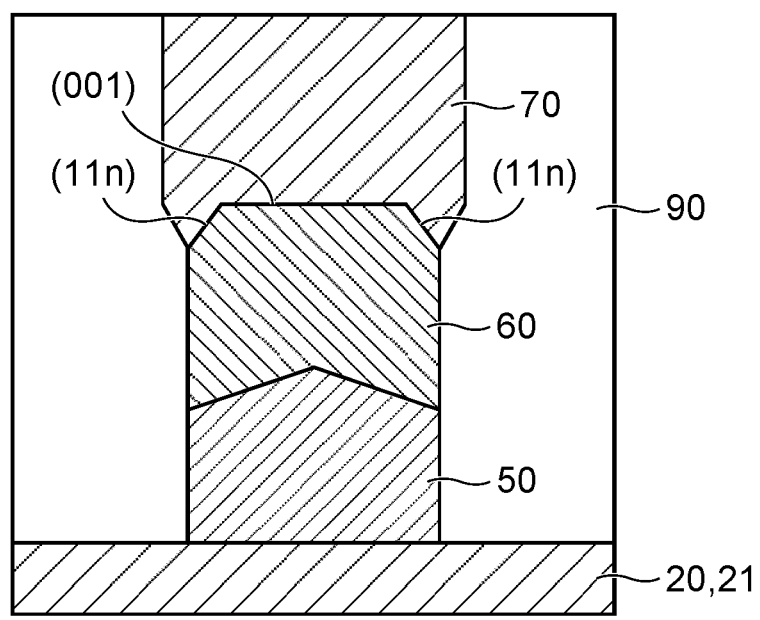
FIG. 17 is a cross-sectional view illustrating an example of a contact structure of a semiconductor device according to a first modification of the second embodiment.

FIG. 17 is a cross-sectional view illustrating an example of a contact structure of a semiconductor device according to a first modification of the second embodiment. In the first modification, the first epitaxial layer 50 is formed by causing epitaxial growth of silicon on the drain layer 20 or the source layer 21. At this time, a top surface of the first epitaxial layer 50 includes a surface inclined with respect to the (001) surface, assuming that the surface of the semiconductor substrate 10 is the (001) surface. The inclined surface is the (113) surface, for example. That is, as illustrated in FIG. 17, the top surface of the first epitaxial layer 50 includes a facet inclined with respect to the surface of the semiconductor substrate 10. Other configurations of the first modification may be identical to those of the second embodiment. Even in the first modification, effects identical to those of the second embodiment may be achieved. The first modification may be combined with the first embodiment.

(Second Modification)

Figure 18:
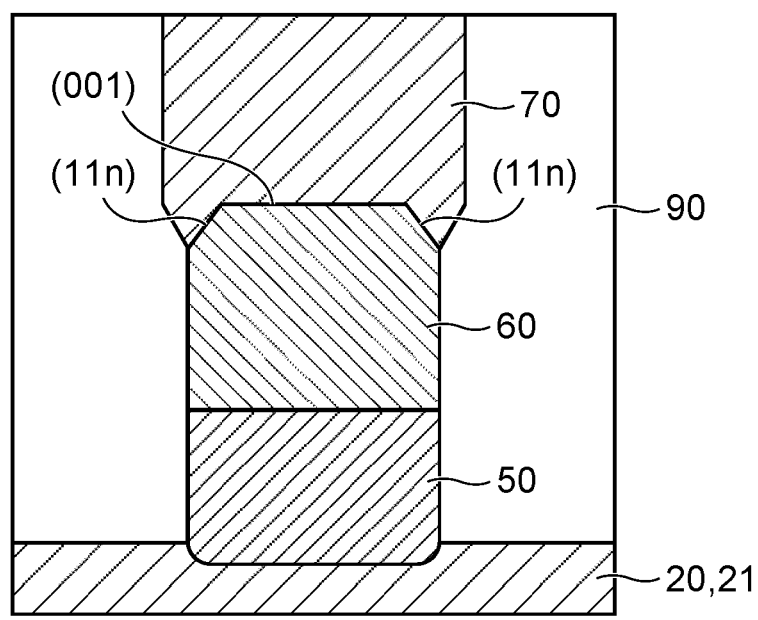
FIG. 18 is a cross-sectional view illustrating an example of a contact structure of a semiconductor device according to a second modification of the second embodiment.

FIG. 18 is a cross-sectional view illustrating an example of a contact structure of a semiconductor device according to a second modification of the second embodiment. In the second modification, the drain layer 20 or the source layer 21 is concave in its upper portion, and the first epitaxial layer 50 is formed by epitaxial growth from the concave portion of the drain layer 20 or the source layer 21. Other configurations of the second modification may be identical to those of the second embodiment. Even in the second modification, effects identical to those of the second embodiment may be achieved. The second modification may be combined with the first embodiment.

(Third Modification)

Figure 19:
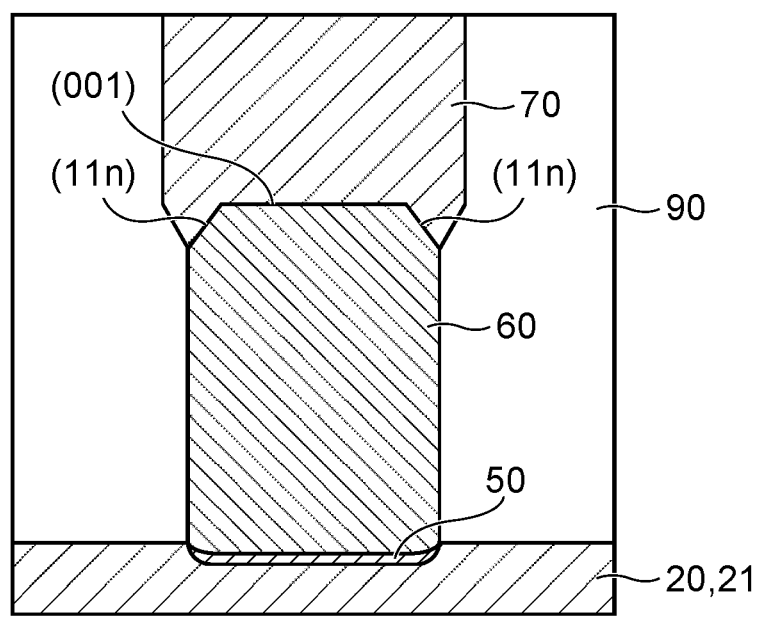
FIG. 19 is a cross-sectional view illustrating an example of a contact structure of a semiconductor device according to a third modification of the second embodiment.

FIG. 19 is a cross-sectional view illustrating an example of a contact structure of a semiconductor device according to a third modification of the second embodiment. In the third modification, the drain layer 20 or the source layer 21 is concave in its upper portion, and the first epitaxial layer 50 is formed by epitaxial growth from the concave portion of the drain layer 20 or the source layer 21. However, the first epitaxial layer 50 is provided only to reach a level lower than the other portion of the top surface of the drain layer 20 or the source layer 21. That is, the first epitaxial layer 50 is formed within the concave portion. Other configurations of the third modification may be identical to those of the second embodiment. Even in the third modification, effects identical to those of the second embodiment may be achieved. The third modification may be combined with the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate;
a transistor including a source layer and a drain layer that are provided in a surface region of the substrate and contain impurities, a gate dielectric film provided on the substrate between the source layer and the drain layer, a gate electrode provided on the gate dielectric film, a first epitaxial layer provided on the source layer or the drain layer, a second epitaxial layer that is provided on the first epitaxial layer and contains both the impurities and carbon, and a contact plug provided on the second epitaxial layer; and
a memory cell array provided above the transistor, wherein
the first epitaxial layer is an undoped epitaxial layer with a lower impurity concentration than that of the second epitaxial layer.

2. The device of claim 1, wherein
the transistor is a P-MOSFET (Metal Oxide Semiconductor Field Effect Transistor), and
the impurities are boron.

3. The device of claim 1, wherein an impurity concentration of the second epitaxial layer is $1 \times 10^{21}$ cm$^{-3}$ or more and a carbon concentration thereof is $3 \times 10^{20}$ cm$^{-3}$ or more.

4. The device of claim 2, wherein an impurity concentration of the second epitaxial layer is $1 \times 10^{21}$ cm$^{-3}$ or more and a carbon concentration thereof is $3 \times 10^{20}$ cm$^{-3}$ or more.

5. The device of claim 1, wherein a top surface of the second epitaxial layer that is in contact with the contact plug is a (11n) surface (n is a positive integer) when a surface of the substrate is assumed to be a (001) surface.

6. The device of claim 1, wherein the transistor is a portion of a control circuit controlling the memory cell array.

7. The device of claim 1, further comprising a silicide layer provided between the second epitaxial layer and the contact plug and containing Ti, Si, B, and C.

8. The device of claim 1, wherein the first epitaxial layer is provided to reach a higher level than a surface of the substrate.

9. The device of claim 2, wherein a top surface of the second epitaxial layer that is in contact with the contact plug is a (11n) surface (n is a positive integer) when a surface of the substrate is assumed to be a (001) surface.

10. The device of claim 2, wherein the first epitaxial layer is provided to reach a higher level than a surface of the substrate.

11. A manufacturing method of a semiconductor device comprising:
forming a gate dielectric film on a substrate;
forming a gate electrode on the gate dielectric film;
introducing impurities into a surface region of the substrate in order to form a source layer and a drain layer;
forming a first epitaxial layer by causing epitaxial growth of semiconductor crystal on the source layer or the drain layer to a higher level than a surface of the substrate;
forming a second epitaxial layer doped with both the impurities and carbon by causing epitaxial growth of semiconductor crystal on the first epitaxial layer;
forming a contact plug on the second epitaxial layer; and
forming a memory cell array above the gate electrode.

12. The method of claim 11, wherein the second epitaxial layer is formed by causing epitaxial growth of semiconductor crystal while doping both the impurities and carbon.

13. The method of claim 11, wherein the second epitaxial layer is formed by causing epitaxial growth of semiconductor crystal while doping the impurities, and thereafter performing ion implantation of carbon.

14. The method of claim 11, wherein the second epitaxial layer is formed by causing epitaxial growth of semiconductor crystal without doping the impurities, and thereafter performing ion implantation of the impurities and carbon.

15. The method of claim 11, wherein
the transistor is a P-MOSFET (Metal Oxide Semiconductor Field Effect Transistor), and
the impurities are boron.

16. The method of claim 11, wherein the first epitaxial layer is an undoped epitaxial layer with a lower impurity concentration than that of the second epitaxial layer.

17. The method of claim 11, wherein an impurity concentration of the second epitaxial layer is $1\times10^{21}$ cm$^{-3}$ or more and a carbon concentration thereof is $3\times10^{20}$ cm$^{-3}$ or more.

18. The method of claim 11, wherein the second epitaxial layer is epitaxially grown to have a (11n) surface (n is a positive integer) when a surface of the substrate is assumed to be a (001) surface.

19. The method of claim 11, wherein the transistor is a portion of a control circuit controlling the memory cell array.

20. The method of claim 11, further comprising forming a silicide layer provided between the second epitaxial layer and the contact plug and containing Tl, Si, B, and C.

* * * * *